Feb. 11, 1964 R. J. FOSTER 3,121,188

ELECTRONIC COMPONENT PACKAGING

Filed Jan. 29, 1962 2 Sheets-Sheet 1

*INVENTOR.*
ROBERT J. FOSTER

*BY* [signature]

ATTORNEY

Feb. 11, 1964 R. J. FOSTER 3,121,188

ELECTRONIC COMPONENT PACKAGING

Filed Jan. 29, 1962 2 Sheets-Sheet 2

INVENTOR.
ROBERT J. FOSTER

BY

ATTORNEY 3,121,188
Patented Feb. 11, 1964

3,121,188

ELECTRONIC COMPONENT PACKAGING

Robert J. Foster, Munroe Falls, Ohio, assignor to Goodyear Aerospace Corporation, a corporation of Delaware Filed Jan. 29, 1962, Ser. No. 169,513
5 Claims. (Cl. 317—100)

The present invention relates to an electronic component packaging unit and more particularly to a mesh screen packaging unit.

Heretofore it has been a common practice to mount the electronic components of an entire electronic circuit on a light metal chassis. Receptacles secured to the chassis position the electronic components on the chassis. Conductor wires soldered or brazed to the respective receptacles interconnect the various components to form the desired electronic circuit. This type of construction does not effectively transfer the heat produced by the electronic components away from the circuit. The large number of electrical conductors interconnecting the separate electronic components increase the weight of the circuit and make it difficult to assemble and repair the circuit. This type of structure furthermore does not protect various portions of the circuit from outside electrical interference.

It is the general object of the invention to avoid and overcome the foregoing and other difficulties of the prior art structures by the provision of a versatile and simple electronic component packaging structure.

Another object of the invention is to provide an electronic component packaging unit which is readily assembled and easily repaired.

Another object of the invention is to provide an electronic component packaging unit which inhibits heat flow between the separate electronic components and is accessible for temperature stabilization by convection and/or conduction heat transfer.

Another object of the invention is to provide an electronic component packaging unit which electrically shields individual or groups of electronic components.

According to the invention the electronic component packaging unit comprises a mesh screen enclosed in a frame structure. The separate components of an electronic circuit are soldered or brazed to the screen or frame. The components may comprise magnetic cores and multi-aperture magnetic cores insulatively secured to the screen or frame. Insulated terminals are installed in openings in the screen at circuit termination points. The separate components are conductively interconnected with flat conductor materials deposited on a strip of insulative material. The individual units may be assembled in juxtaposed relationship to form a tube through which a cooling fluid is permitted to flow to reduce and stabilize the temperature of the electronic components of the circuit. Alternatively, the packaging units containing the electronic components may contain a heat conductive and electrically insulative material to provide the unit with thermal stability.

The exact nature of this invention as well as other objects and advantages thereof will be readily apparent from the consideration of the following specification relating to the annexed drawings in which.

Figure 1:
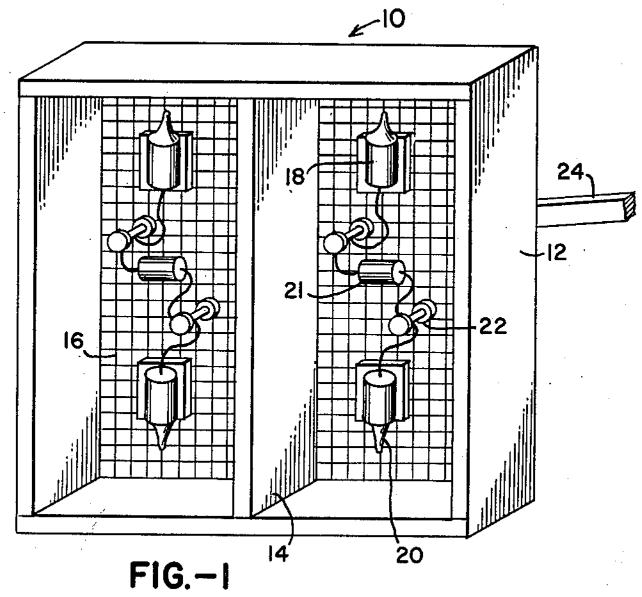
FIG. 1 is a perspective view of the packaging unit in accordance with the invention.

Referring now to the drawing, there is shown in FIG. 1 a packaging unit 10. The unit is supported by a rectangular shaped frame 12. The depth of the frame 12 can be varied to accommodate various size electrical components. A metal barrier strip 14 is positioned within the rectangular frame 12 and functions as an electrical shield between selected electronic components.

A mesh screen 16 is positioned in a plane to extend over the area enclosed by the frame 12 and is secured to the frame to form a box-like structure having a screen bottom. The screen may be of aluminum mesh or similar high heat conductive material which permits it to function as an electrical shield and as a radiator to dissipate heat.

Figure 2:
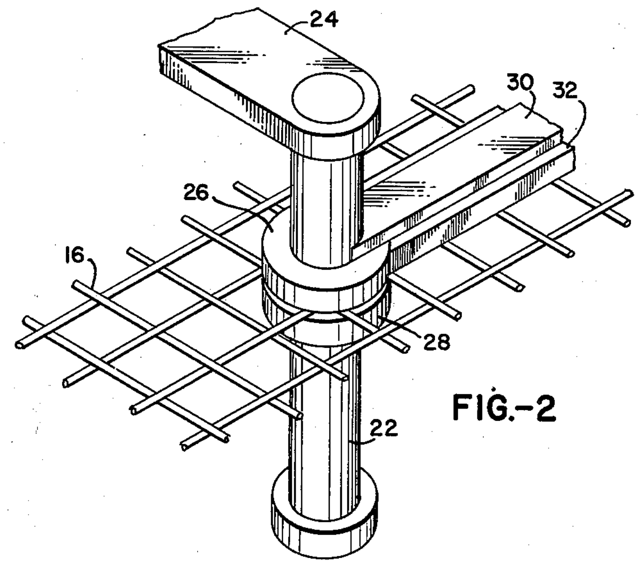
FIG. 2 is a perspective view of the terminal mounting means and the attached electrical conductor used in the unit of FIG. 1.

Component mounting shields 18 are brazed or silver-soldered to the inside surface of the screen 16. Positioned within the shields 18 are thermogenerating components 20. These thermogenerating components are connected to other electronic components 21 of the circuit. At circuit termination points terminals 22 are installed in the openings of the screen. A flat printed cable 24 is soldered to one end of the terminal 22. The cable 24 functions as the electrical conductor to and from the components in the unit. As shown in FIG. 2, the terminal 22 extends transversely through the screen 16. The terminal 22 extends through a retaining cylinder 26. The cylinder 26 has a circumferentially extending annular groove 28 on its outer peripheral surface. The individual strands of the screen are seated in the annular groove 28 and hold the cylinder and terminal on the screen. This construction permits the terminals to be placed wherever desired in the screen.

An electrically conductive material 30 deposited on a flat electrically insulative material 32 interconnects the separate terminals of the circuit. The insulative material is placed on the screen surface and extends between the separate terminals. The deposited conductor material and insulative material replaces the common circuit board. This structure substantially decreases the weight of the individual units.

Figure 3:
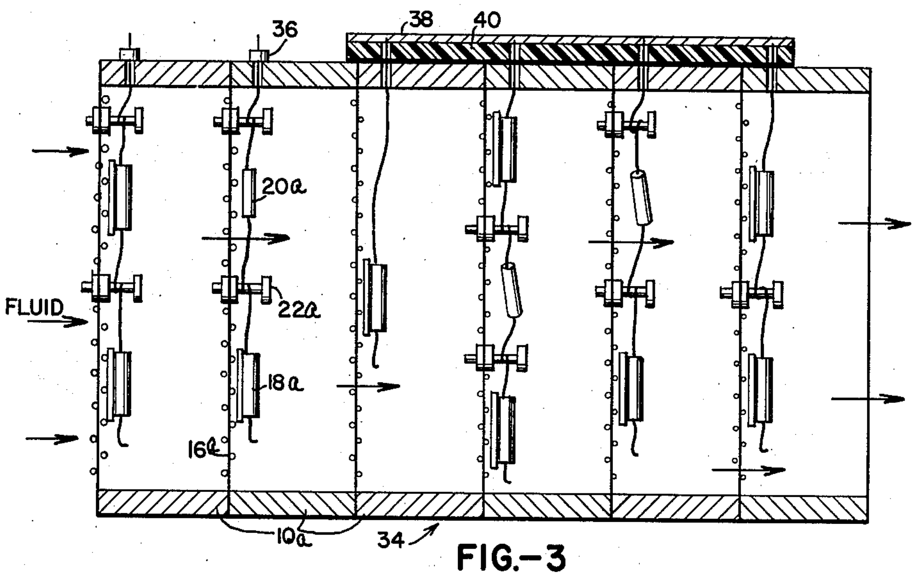
FIG. 3 is a cross-sectional view of a plurality of stacked packaging units arranged for convection cooling.

Referring to FIG. 3, there is shown a plurality of juxtaposed axially aligned packaging units **10*a*. Each unit contains the electronic components 18*a* and 20*a* and terminals 22*a* mounted on the screen mesh 16*a*. The array of units 34 forms a conduit for the passage of a cooling fluid through the separate units. Electrical connectors 36 may be secured to the frames of the units to accommodate the conductor wires of the electronic circuit within the unit. The electronic circuit may require several units to be interconnected. This is accomplished by a flat ribbon cable 38 positioned on insulative material 40. The cable 38** is electrically connected to the conductor wires of the electronic circuit within the individual package units.

Figure 4:
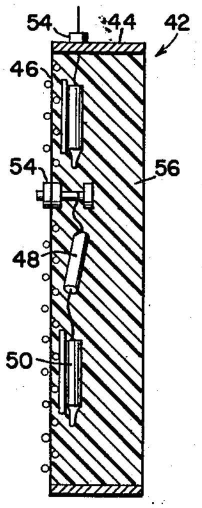
FIG. 4 is a cross-sectional view of a packaging unit modified for conduction cooling.

Referring to FIG. 4, the packaging unit 42 includes a frame 44 secured to the peripheral edges of a mesh screen 46. The components 48 and 50 and terminals 52 of electronic circuit are secured to the inner surface of the screen. A connector 54 secured to the frame 44 accommodates the wire conductors of the electronic circuit. A thermosetting resin 56 having electrically insulative and heat conductive properties is positioned within the frame 44 and in direct contact with the components of the electronic circuit. The resin functions as a heat sink and provides the packaging unit with uniform thermal characteristics.

Figure 5:
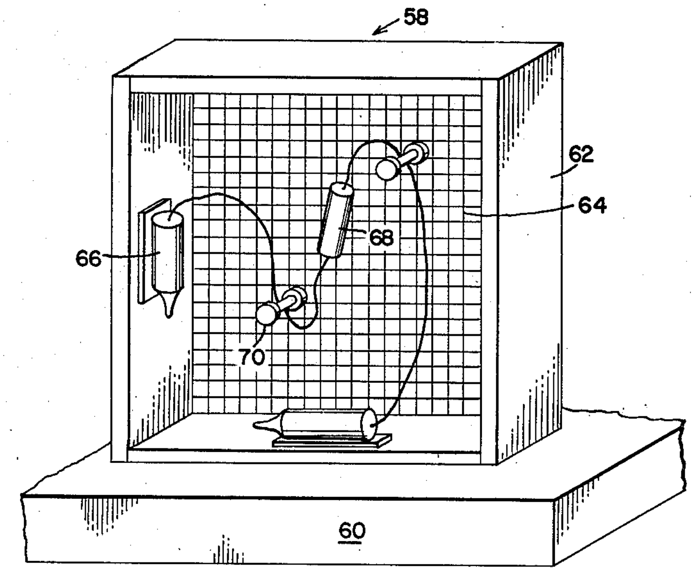
FIG. 5 is a perspective view of a modified packaging unit arranged for conduction cooling.

FIG. 5 shows a packaging unit 58 positioned on a heat sink base 60. The unit 58 includes a rectangular shaped frame 62 secured to the peripheral edges of a mesh screen 64. The frame 62 is formed from a material that has high heat conductive properties. The thermo-generating components 66 of the electronic circuit are mounted in surface engagement with the heat conductive frame 62. The components 68 of the electronic circuit is mounted on the terminals 70. The terminals 70 are positioned in and held by the mesh screen 64. The heat produced by the electronic components 66 will be conducted through the material of the frame 62 to the heat sink face 60 thereby inhibiting the flow of heat to the component 68.

While there have been shown and described and pointed out the fundamental novel features of the invention as applied to the several embodiments, it will be understood that the various omissions, substitutions, changes in form, and details of the packaging unit illustrated may be made by those skilled in the art, without departing from the spirit of the invention. It is the intention to be limited only as indicated by the scope of the following claims.

What is claimed is:

1. In combination,
frame means enclosing a determinate area,
a mesh screen extending over the enclosed area and secured to the frame means, said mesh screen made from a high heat conductive metal,
terminal means,
means securing the terminal means to and insulating the terminal means from the screen,
and components of an electronic circuit connected to the terminal means.

2. The combination defined in claim 1,
wherein the means securing the terminals to the screen comprises
a cylindrical member made from an electrical insulating material having a circumferentially extending annular groove on its outer peripheral surface, a central post made from a conductive material operatively positioned inside the cylindrical member, said member being positioned in the screen so that the strands thereof are placed in the annular groove.

3. In combination,
a mesh screen made from a high heat conductive material,
terminal holding means mounted on the screen, said holding means comprising a cylindrical member made from an electrical insulating material having a circumferentially extending annular groove on its outer peripheral surface, said member being positioned in the screen so that a plurality of strands thereof are placed in the annular groove.

4. In an electronic package having all components thermally interconnected to achieve an equal heat dissipation throughout, the combination of,
frame means made from a heat conductive material enclosing a determinate area,
a mesh screen made from a heat conductive material extending over the enclosed area and secured to the frame means,
terminal means mounted on and electrically insulated from the screen,
electronic components including heat generating elements connected to the terminals, the heat generating elements being mounted to the mesh screen and directly on the frame means whereby the heat generated is evenly dissipated throughout, the combination to eliminate thermal gradients.

5. In an electronic package having all components thermally interconnected to achieve an equal heat dissipation throughout, the combination of,
frame means made from a heat conductive material enclosing a determinate area,
a mesh screen made from a heat conductive material extending over the enclosed area and secured to the frame means,
terminal means mounted on and electrically insulated from the screen,
electronic components including heat generating elements secured to the screen and connected to the terminal means,
and a heat conductive and electrically insulative material positioned around the components in direct contact therewith.

References Cited in the file of this patent

UNITED STATES PATENTS

| | | |
|---|---|---|
| 3,022,448 | Mason | Feb. 20, 1962 |
| 3,061,760 | Ezzo | Oct. 30, 1962 |